(12) United States Patent
Xu

(10) Patent No.: US 11,360,714 B2
(45) Date of Patent: Jun. 14, 2022

(54) METHOD AND CONTROLLER FOR PROCESSING, BASED ON GLOBAL WRITE STAMP, COLD AND DISTURBED DATA BLOCK

(71) Applicant: HUAWEI TECHNOLOGIES CO., LTD., Guangdong (CN)

(72) Inventor: Lu Xu, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/157,342

(22) Filed: Jan. 25, 2021

(65) Prior Publication Data
US 2021/0141544 A1     May 13, 2021

Related U.S. Application Data

(63) Continuation of application No. PCT/CN2018/097255, filed on Jul. 26, 2018.

(51) Int. Cl.
*G06F 3/06*      (2006.01)
(52) U.S. Cl.
CPC ............ *G06F 3/0673* (2013.01); *G06F 3/061* (2013.01); *G06F 3/064* (2013.01); *G06F 3/0647* (2013.01)
(58) Field of Classification Search
CPC ........ G06F 3/061; G06F 3/064; G06F 3/0647; G06F 3/0673
See application file for complete search history.

(56) References Cited

U.S. PATENT DOCUMENTS

| 6,032,264 | A | 2/2000 | Beffa et al. |
| 9,477,551 | B1 | 10/2016 | Piszczek et al. |
| 10,381,073 | B1* | 8/2019 | Bradshaw ........ G11C 13/0069 |
| 2012/0023144 | A1 | 1/2012 | Rub |

(Continued)

FOREIGN PATENT DOCUMENTS

| CN | 101477492 A | 7/2009 |
| CN | 104376875 A | 2/2015 |

(Continued)

OTHER PUBLICATIONS

PCT International Search Report and Written Opinion issued in International Application No. PCT/CN2018/097255 dated Apr. 25, 2019, 15 pages (with English translation).

(Continued)

*Primary Examiner* — Chie Yew
(74) *Attorney, Agent, or Firm* — Fish & Richardson P.C.

(57) ABSTRACT

Embodiments of this application disclose example methods for processing data blocks and controllers. One example method includes configuring, by a controller, a counter of a global write stamp where the global write stamp is used to represent a total quantity of times that the controller performs writing on a storage medium. When a write operation is performed on a physical data block in the storage medium, a global write stamp can be used at a current moment as an instant write stamp of the physical data block, and the instant write stamp can be stored. Physical data blocks can be inspected periodically. When the physical data block is inspected, a determination as to whether the physical data block is a to-be-moved data block can be made based on the stored instant write stamp.

14 Claims, 4 Drawing Sheets

(56) References Cited

U.S. PATENT DOCUMENTS

| | | | |
|---|---|---|---|
| 2013/0173854 A1* | 7/2013 | Shim | G06F 3/061 |
| | | | 711/103 |
| 2017/0199820 A1* | 7/2017 | Romanovskiy | G06F 3/067 |
| 2018/0329646 A1* | 11/2018 | Dai | G06F 3/0604 |
| 2019/0303283 A1* | 10/2019 | McGlaughlin | G11C 16/08 |

FOREIGN PATENT DOCUMENTS

| | | |
|---|---|---|
| CN | 106462500 A | 2/2017 |
| CN | 107977319 A | 5/2018 |

OTHER PUBLICATIONS

Office Action issued in Chinese Application No. 201880095996.5 dated Dec. 1, 2021, 9 pages.

\* cited by examiner

METHOD AND CONTROLLER FOR PROCESSING, BASED ON GLOBAL WRITE STAMP, COLD AND DISTURBED DATA BLOCK

CROSS-REFERENCE TO RELATED APPLICATIONS

This application is a continuation of International Application No. PCT/CN2018/097255, filed on Jul. 26, 2018, the disclosure of which is hereby incorporated by reference in its entirety.

TECHNICAL FIELD

This application relates to the field of storage technologies, and in particular, to a method for processing a data block and a controller.

BACKGROUND

With rapid development of storage technologies, some emerging storage media such as a flash memory and a phase change memory (PCM) emerge. This type of storage media has advantages such as a faster read/write speed and a longer service life. However, there are also some reliability problems: (1) This type of media has a limit on a quantity of write times. For a same area, repeated erasing and writing slow down a read speed or even damage the area to result in that the area cannot be used. Therefore, each storage area needs to be used on average, to prevent bad blocks from being generated due to overuse of some blocks. (2) Consecutive read or write operations on one block may disturb surrounding blocks, and this results in data invalidity of the surrounding blocks.

In the prior art, for the foregoing two problems, a wear leveling algorithm and a disturb algorithm are separately used to perform independent processing. This separate and independent processing manner causes relatively high complexity and relatively high calculation overheads.

SUMMARY

A technical problem to be resolved in embodiments of this application is to provide a method for processing a data block and a controller, to reduce complexity of processing a reliability problem of a storage medium and reduce calculation overheads.

According to a first aspect, an embodiment of this application provides a method for processing a data block, and the method may include:

configuring, by a controller, a counter of a global write stamp, where the global write stamp is used to represent a total quantity of times that the controller performs writing on a storage medium;

when a write operation is performed on a physical data block in the storage medium, using a global write stamp at the moment as an instant write stamp of the physical data block, and storing the instant write stamp in metadata of the physical data block;

inspecting all physical data blocks in the storage medium, and when a count of the global write stamp increases by a quantity threshold each time, triggering a check on a corresponding single physical data block based on an inspection sequence;

when the physical data block is inspected, determining, based on the instant write stamp in the metadata of the physical data block, whether the physical data block is a to-be-moved data block, where the to-be-moved data block includes a cold data block and a disturbed data block; and if the physical data block is the to-be-moved data block, moving the physical data block.

In a possible implementation, the determining, based on the instant write stamp in the metadata of the physical data block, whether the physical data block is a to-be-moved data block includes:

The controller determines, based on the instant write stamp of the physical data block and a current global write stamp, whether the physical data block is the cold data block; and the controller determines, based on the instant write stamp of the physical data block and instant write stamps stored in adjacent physical data blocks, whether the physical data block is the disturbed data block.

In a possible implementation, that the controller determines, based on the instant write stamp of the physical data block and a current global write stamp, whether the physical data block is the cold data block includes:

comparing, by the controller, the current global write stamp with the instant write stamp of the physical data block;

determining whether a difference between the current global write stamp and the instant write stamp of the physical data block reaches a first preset threshold; and if the difference reaches the first preset threshold, determining that the physical data block is the cold data block.

In a possible implementation, that the controller determines, based on the instant write stamp of the physical data block and instant write stamps stored in adjacent physical data blocks, whether the physical data block is the disturbed data block includes:

comparing, by the controller, a sum of the instant write stamps stored in the adjacent physical data blocks with the instant write stamp of the physical data block;

determining, based on a difference between the sum of the instant write stamps stored in the adjacent physical data blocks and the instant write stamp of the physical data block, a quantity of times that the physical data block is disturbed;

determining whether the quantity of times that the physical data block is disturbed reaches a second preset threshold; and if the quantity of times that the physical data block is disturbed reaches the second preset threshold, determining that the physical data block is the disturbed data block.

In a possible implementation, the method further includes:

when the physical data block is inspected, determining, based on a quantity of remaining write times from the current global write stamp to a next inspection of the physical data block, a future maximum quantity of times that the physical data block is disturbed;

determining whether a sum of the quantity of times that the physical data block is disturbed and the future maximum quantity of times that the physical data block is disturbed reaches the second preset threshold; and if the sum of the quantity of times that the physical data block is disturbed and the future maximum quantity of times that the physical data block is disturbed reaches the second preset threshold, determining that the physical data block is the disturbed data block.

In a possible implementation, a counting unit of the counter is x, and x is an integer greater than or equal to 1.

In a possible implementation, if the physical data block is the to-be-moved data block, the moving the physical data block includes:

The controller reconfigures a mapping relationship between a physical block address and a logical block address of the to-be-moved data block to implement moving.

In a possible implementation, if a quantity of to-be-moved data blocks determined during inspection is more than one, synchronous processing or asynchronous processing is performed on the more than one to-be-moved data blocks when moving processing is performed.

According to a second aspect, an embodiment of this application provides a controller, and the controller may include:

a configuration unit, adapted to configure, by a controller, a counter of a global write stamp, where the global write stamp is used to represent a total quantity of times that the controller performs writing on a storage medium;

a storage unit, adapted to: when a write operation is performed on a physical data block in the storage medium, use a global write stamp at the moment as an instant write stamp of the physical data block, and store the instant write stamp in metadata of the physical data block;

an inspection unit, adapted to inspect all physical data blocks in the storage medium, and when a count of the global write stamp increases by a quantity threshold each time, trigger a check on a corresponding single physical data block based on an inspection sequence;

a determining unit, adapted to: when the physical data block is inspected, determine, based on the instant write stamp in the metadata of the physical data block, whether the physical data block is a to-be-moved data block, where the to-be-moved data block includes a cold data block and a disturbed data block; and a moving unit, adapted to: if the physical data block is the to-be-moved data block, move the physical data block.

In a possible implementation, the determining unit is specifically adapted to:

determine, based on the instant write stamp of the physical data block and a current global write stamp, whether the physical data block is the cold data block; and determine, based on the instant write stamp of the physical data block and instant write stamps stored in adjacent physical data blocks, whether the physical data block is the disturbed data block.

In a possible implementation, when determining, based on the instant write stamp of the physical data block and the current global write stamp, whether the physical data block is the cold data block, the determining unit is specifically adapted to:

compare the current global write stamp with the instant write stamp of the physical data block;

determine whether a difference between the current global write stamp and the instant write stamp of the physical data block reaches a first preset threshold; and if the difference reaches the first preset threshold, determine that the physical data block is the cold data block.

In a possible implementation, when determining, based on the instant write stamp of the physical data block and the instant write stamps stored in the adjacent physical data blocks, whether the physical data block is the disturbed data block, the determining unit is specifically adapted to:

compare a sum of the instant write stamps stored in the adjacent physical data blocks with the instant write stamp of the physical data block;

determine, based on a difference between the sum of the instant write stamps stored in the adjacent physical data blocks and the instant write stamp of the physical data block, a quantity of times that the physical data block is disturbed;

determine whether the quantity of times that the physical data block is disturbed reaches a second preset threshold; and if the quantity of times that the physical data block is disturbed reaches the second preset threshold, determine that the physical data block is the disturbed data block.

In a possible implementation, the determining unit is further adapted to:

when the physical data block is inspected, determine, based on a quantity of remaining write times when a current global write stamp reaches a next inspection, a future maximum quantity of times that the physical data block is disturbed;

determine whether a sum of the quantity of times that the physical data block is disturbed and the future maximum quantity of times that the physical data block is disturbed reaches the second preset threshold; and if the sum of the quantity of times that the physical data block is disturbed and the future maximum quantity of times that the physical data block is disturbed reaches the second preset threshold, determine that the physical data block is the disturbed data block.

In a possible implementation, a counting unit of the counter is x, and x is an integer greater than or equal to 1.

In a possible implementation, the moving unit is specifically adapted to:

reconfigure a mapping relationship between a physical block address and a logical block address of the to-be-moved data block to implement moving.

In a possible implementation, if a quantity of to-be-moved data blocks determined during inspection is more than one, the moving unit is adapted to perform synchronous processing or asynchronous processing on the more than one to-be-moved data blocks when performing moving processing.

According to a third aspect, an embodiment of this application provides a controller, and the controller may include:

a processor, a memory, and a bus, where the processor and the memory are connected through the bus, the memory is adapted to store a group of program code, and the processor is adapted to invoke the program code stored in the memory to perform the step in any one of the first aspect or the implementations of the first aspect of the embodiments of this application.

According to a fourth aspect, an embodiment of this application provides a computer-readable storage medium. The computer-readable storage medium stores an instruction, and when the instruction is run on a computer, the method in the first aspect or any implementation of the first aspect is implemented.

BRIEF DESCRIPTION OF DRAWINGS

To describe the technical solutions in the embodiments of this application or in the background more clearly, the following briefly describes the accompanying drawings for describing the embodiments of this application or the background.

DESCRIPTION OF EMBODIMENTS

The following describes the embodiments of this application with reference to the accompanying drawings in the embodiments of this application.

The terms "including", "have", or any other variant thereof mentioned in the specification, claims, and the accompanying drawings of this application, are intended to cover non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the product, or the device.

Figure 1:
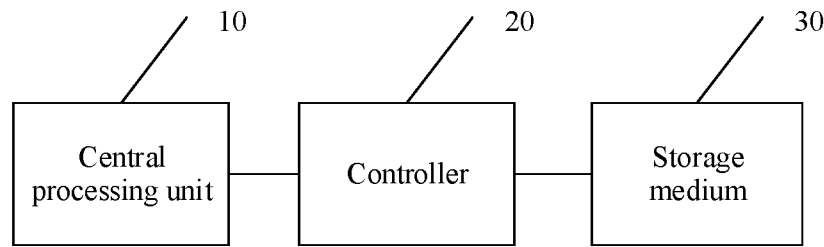
FIG. 1 is a schematic diagram of composition of a system architecture to which a method for processing a data block is applied according to an embodiment of this application.

FIG. 1 is a schematic diagram of composition of a system architecture to which a method for processing a data block is applied according to an embodiment of this application. The system architecture may include but is not limited to a central processing unit 10 (CPU), a controller 20, and a storage medium 30.

The central processing unit 10 may be adapted to read a computer instruction and process data in computer software. The central processing unit 10 is a core component that is in a computer system and that reads an instruction, decodes the instruction, and executes the instruction. As a type of computer operation, a read/write operation of the storage medium may also be performed by the central processing unit 10 by reading a corresponding read/write instruction (including reading/writing).

The controller 20 may also be referred to as a memory controller or a storage controller. The controller 20 may be integrated into the central processing unit 10, or may be independently disposed. This is not limited in this application. When being disposed independently, the controller 20 may be implemented by using an independent chip, such as an application-specific integrated circuit (ASIC), or a field programmable gate array (FPGA). The controller 20 may be adapted to receive a read/write request of the central processing unit 10, and complete a read/write operation on the storage medium 30. In this embodiment of this application, the controller 20 may further manage a physical storage block in the storage medium 30, and perform processing such as filtering and moving on the physical storage block according to a corresponding algorithm.

The storage medium 30 may also be referred to as a memory, a storage apparatus, a storage device, or the like, and may be adapted to store data. The storage medium 30 in this application may be some storage media that require wear leveling processing and interference processing to improve storage reliability, for example, a Flash and a PCM. For convenience, the PCM is used as an example for description in the following embodiments. However, the method for processing a data block in the embodiments of this application is applicable to any type of storage medium that needs to perform cold and hot data block identification and/or disturbed data block identification.

The following describes in detail a method for processing a data block and a controller in this application with reference to FIG. 2 to FIG. 5.

Figure 2:
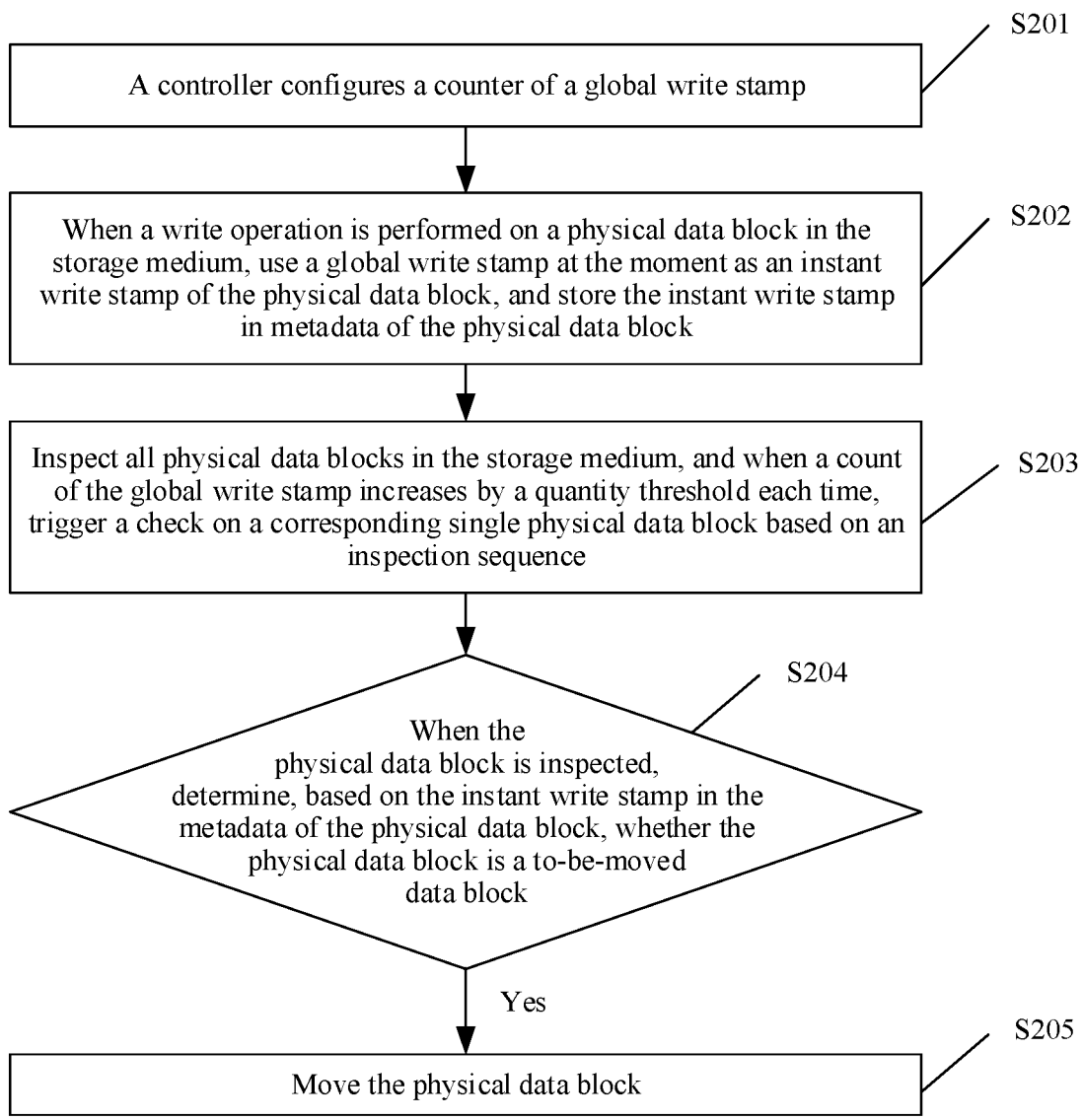
FIG. 2 is a schematic flowchart of a method for processing a data block according to an embodiment of this application.

FIG. 2 is a schematic flowchart of a method for processing a data block according to an embodiment of this application. The method may include the following steps.

S201: A controller configures a counter of a global write stamp.

The global write stamp is used to represent a total quantity of times that the controller performs writing on a storage medium.

The global write stamp is a concept similar to a timestamp, and may also be referred to as global write times, or the like. A specific representation form may be a value, and in a computer system, the value may be represented in binary.

For ease of understanding, the global write stamp is described in a form of a value. For example, if an input/output interface of the controller detects 500 write operations on the storage medium, the value of the global write stamp is 500.

Optionally, because a quantity of read/write times of the storage medium is relatively large, a counting unit of the counter may be configured as x, and x is an integer greater than or equal to 1. In other words, when a count value of the counter reaches x, the value of the global write stamp is increased by 1.

For example, if x is 1 and the quantity of write times is 500, the value of the global write stamp is 500. When x is 10 and the quantity of write times is 500, the global write stamp is 50. When the quantity of write times is 501 to 509, the global write stamp is still 50. When the quantity of write times reaches 510, the global write stamp is 51. For ease of description and understanding, the following provides description and description by using an example in which x is equal to 1.

S202: When a write operation is performed on a physical data block in the storage medium, use a global write stamp at the moment as an instant write stamp of the physical data block, and store the instant write stamp in metadata of the physical data block.

It should be noted that, for a physical data block, the instant write stamp in this application is completely different from a current absolute quantity of write times of the physical data block. A value of the instant write stamp is equal to a value of the global write stamp at a current moment.

For example, if the $500^{th}$ write operation occurs on a physical data block A, an instant write stamp stored in metadata of the physical data block A is 500. If the $501^{st}$ write operation occurs on a physical data block B, an instant write stamp stored in metadata of the physical data block B is 501. If subsequent 400 write operations do not occur on the physical data block A or B, instant write stamps of the two physical data blocks remain unchanged. When the $902^{nd}$ write operation occurs on the physical data block A, the instant write stamp stored in the metadata of the physical data block A changes from 500 to 902. When the $1000^{th}$ write operation occurs on the physical data block B, the instant write stamp stored in the metadata of the physical data block B changes from 501 to 1000.

S203: Inspect all physical data blocks in the storage medium, and when a count of the global write stamp increases by a quantity threshold each time, trigger a check on a corresponding single physical data block based on an inspection sequence.

The quantity threshold herein is similar to a period, but is irrelevant to time, and is related to a quantity of write times. Inspection can be regarded as a cyclical check on all physical data blocks in sequence. The inspection sequence may be determined based on an arrangement sequence of the physical data blocks, or may be determined according to another algorithm in which a sequence is an independent variable. This is not limited in this embodiment of this application. The check in sequence may be performed based on the quantity threshold. When the count of the global write stamp increases by a quantity threshold, for example, 10 times, the first physical data block is checked; when the count of the global write stamp increases by a quantity threshold, the second physical data block is checked, and the check is completed in sequence as the count increases until the last data block is checked; and when the count of global write stamps increases by a quantity threshold, the first data block can be checked again.

For example, there are a total of 10000 physical data blocks, arranged in a manner of 100 rows and 100 columns, and the quantity threshold is 10 times. In this case, the check may start from the first physical data block in the first row based on the arrangement sequence of the physical data blocks, and when the global write stamp increases from 0 to 1, the first physical data block in the first row is checked. When the global write stamp increases from 10 to 20, the second physical data block in the first row is checked. After physical data blocks in the first row are checked, the check starts from the first data block in the second row. The check is performed in sequence based on the count increase until all the physical data blocks are checked. Then, the check starts from the first physical data block in the first row again.

S204: When the physical data block is inspected, determine, based on the instant write stamp in the metadata of the physical data block, whether the physical data block is a to-be-moved data block.

The to-be-moved data block includes a cold data block and a disturbed data block.

During inspection, all data blocks in the storage medium may be detected in sequence to determine whether the data blocks need to be moved. In this embodiment of this application, detection of one physical data block is specifically used for description and description. Detection and processing of other physical data blocks are the same, and details are not described herein again.

In a storage medium such as a PCM, the cold data block may be considered as a data block that is not accessed or that is written for less than a specific quantity of times within a specific time. In addition, in this type of medium, a plurality of read and write operations performed on a same physical data block disturb an adjacent physical data block of the same physical data block, and consequently, data of the adjacent physical data block is invalid. For a disturbed data block whose data is invalid, the disturbed data block may also be referred to as a victim, and a physical data block adjacent to the disturbed data block may be referred to as an aggressor.

In this embodiment of this application, after the concept of the global write stamp is introduced, the quantity of write times of the entire storage medium may be measured by using the global write stamp, and access to the single physical data block may be measured by using the global write stamp at the current moment as the instant write stamp. Therefore, a plurality of concepts are uniformly represented. For a reliability problem of different storage media, if the global write stamp becomes large as the quantity of write times increases, but an instant write stamp of a physical data block is small, it indicates that the instant write stamp of the physical data block does not change for a long time. In other words, the physical data block is not accessed or written to data for a long time. Therefore, the physical data block can be considered as a cold data block. If an instant write stamp of a physical data block is far less than a sum of instant write stamps of adjacent physical data blocks of the physical data block, it indicates that a quantity of times that the physical data block is accessed is far less than a quantity of times that the adjacent physical data blocks are accessed, and it indicates that the physical data block often disturbs by the adjacent physical data blocks. The physical data block may be considered as a disturbed data block.

Therefore, in this embodiment of this application, a concept of the global write stamp is constructed, and the global write stamp is used as a unified basis for determining the cold data block and the disturbed data block, so that normalization of a storage medium reliability algorithm can be implemented, to reduce calculation overheads.

S205: If the physical data block is the to-be-moved data block, move the physical data block.

Optionally, during moving, the controller reconfigures a mapping relationship between a physical block address and a logical block address of the to-be-moved data block to implement moving.

For example, for a physical block address of the cold data block, a currently mapped logical block address of the cold data block may be changed to an address of an idle block. In this way, when a next write operation is performed, the logical block address is preferentially selected as the address of the idle block to perform the write operation. For a physical block address of the disturbed data block, the foregoing operations may also be performed to reduce a quantity of times of the disturbed data block.

Optionally, if a quantity of to-be-moved data blocks determined during inspection is more than one, synchronous processing or asynchronous processing may be performed on the more than one to-be-moved data blocks when moving processing is performed. Flexible configuration and selection may be performed based on system performance and a requirement. This is not limited in this embodiment of this application.

Because the to-be-moved data block includes the cold data block and the disturbed data block, that the determining, based on the instant write stamp in the metadata of the physical data block, whether the physical data block is a to-be-moved data block may include:

The controller determines, based on the instant write stamp of the physical data block and a current global write stamp, whether the physical data block is the cold data block; and the controller determines, based on the instant write stamp of the physical data block and instant write stamps stored in adjacent physical data blocks, whether the physical data block is the disturbed data block.

Figure 3A:
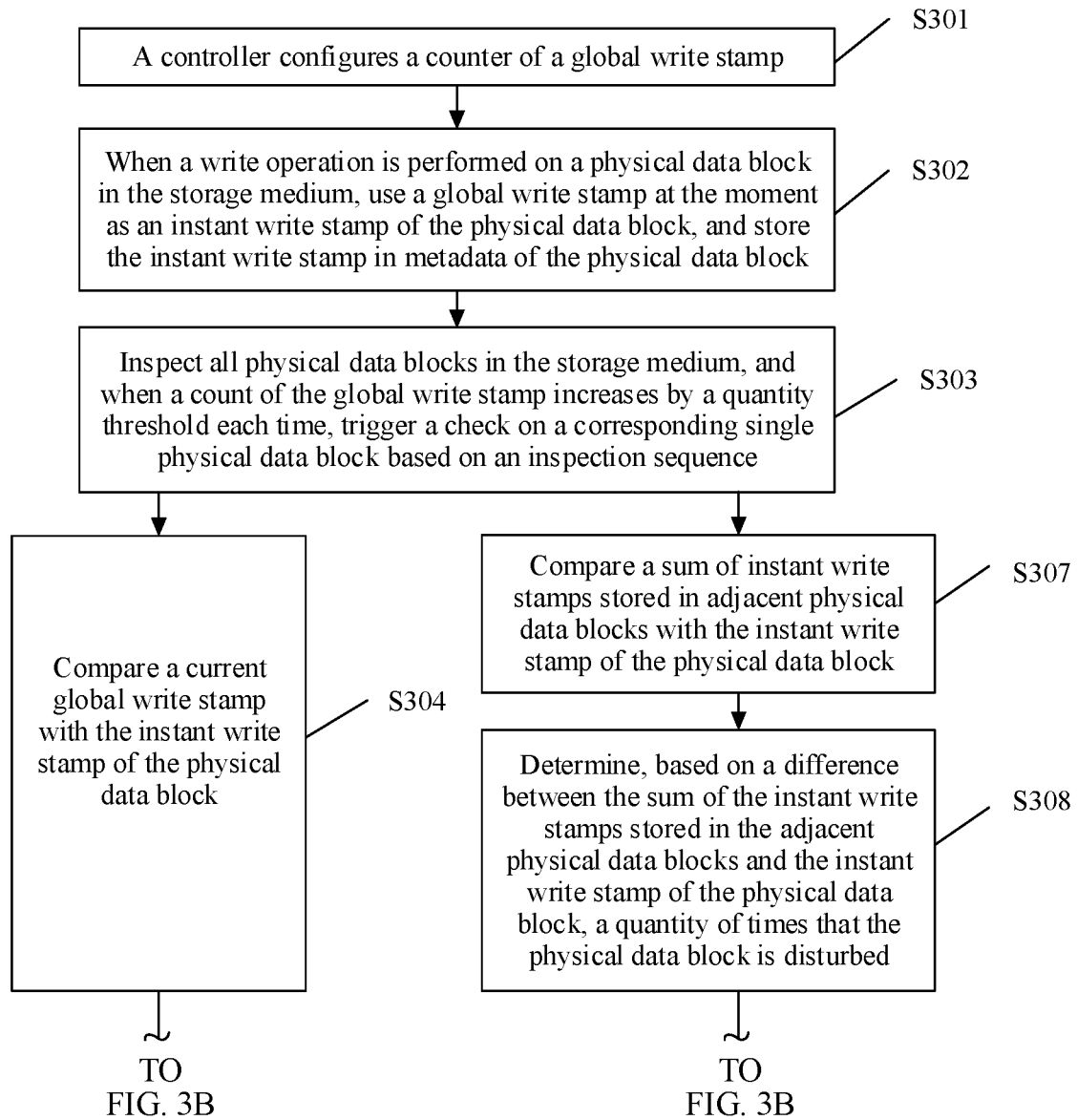
FIG. 3A and FIG. 3B are schematic flowcharts of another method for processing a data block according to an embodiment of this application.
Figure 3B:
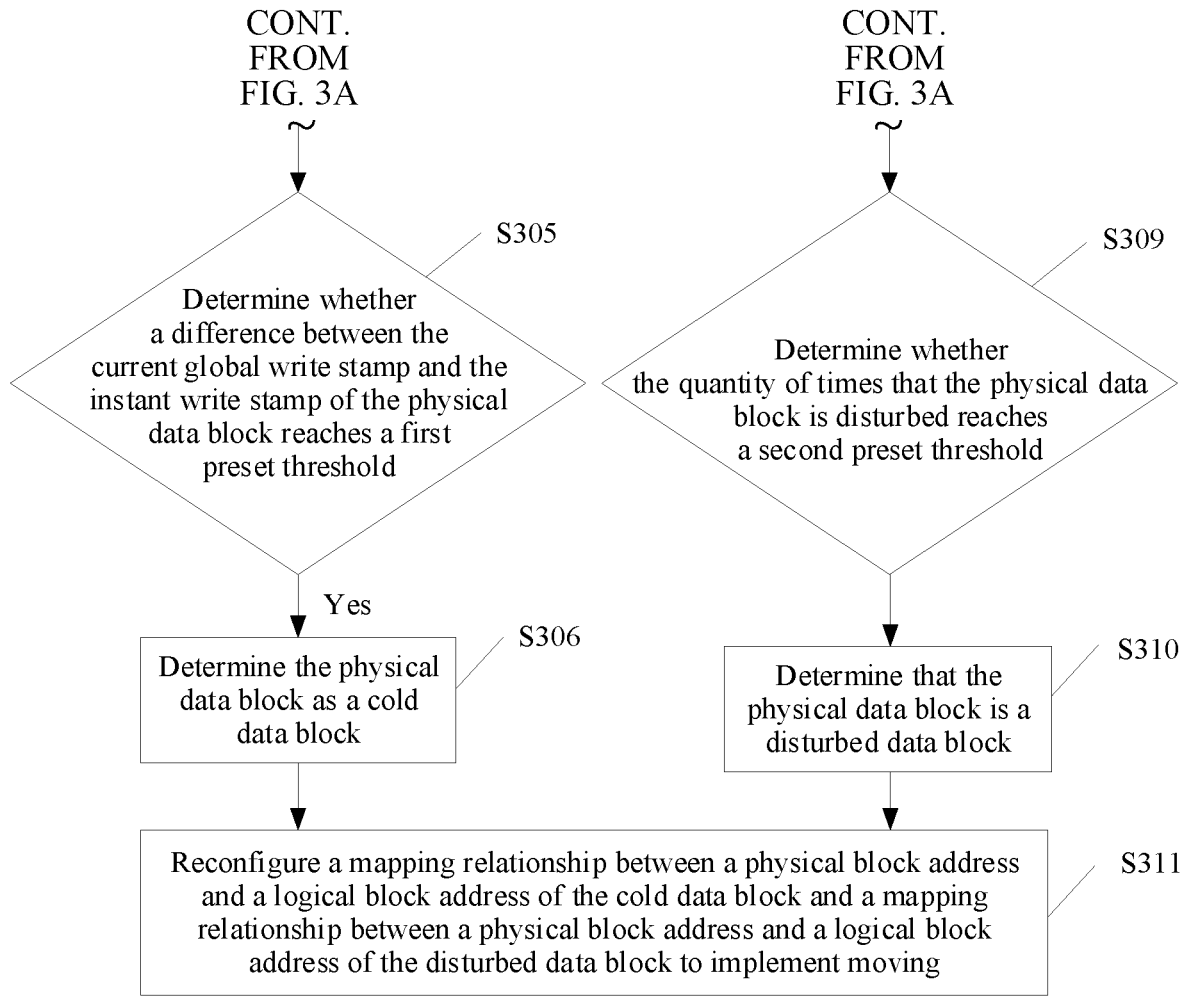

For a specific determining process, refer to FIG. 3A and FIG. 3B. FIG. 3A and FIG. 3B are schematic flowcharts of another method for processing a data block according to an embodiment of this application. The method may include the following steps.

S301: A controller configures a counter of a global write stamp.

The global write stamp is used to represent a total quantity of times that the controller performs writing on a storage medium.

S302: When a write operation is performed on a physical data block in the storage medium, use a global write stamp at the moment as an instant write stamp of the physical data block, and store the instant write stamp in metadata of the physical data block.

S303: When a count of the global write stamp increases by a quantity threshold each time, inspect all physical data blocks in the storage medium.

S304: Compare the current global write stamp with the instant write stamp of the physical data block.

S305: Determine whether a difference between the current global write stamp and the instant write stamp of the physical data block reaches a first preset threshold. If the difference between the current global write stamp and the instant write stamp of the physical data block reaches the first preset threshold, step 306 is performed; otherwise, no additional processing is required.

Optionally, the first preset threshold may be preconfigured by a system, or may be preconfigured for a user to select, or may be customized by the user. This is not limited in this embodiment of this application.

S306: Determine the physical data block as a cold data block. Then, step S311 is performed.

For example, the current global write stamp is 2000, the instant write stamp of the physical data block is 100, and the first preset threshold is 1000. In this case, 2000 minus 100 is equal to 1900, which is greater than 1000. Therefore, it may be determined that the physical data block is the cold data block. If the instant write stamp of the physical data block is 1200, a difference between the current global write stamp and the instant write stamp of the physical data block is 800, which is less than the first preset threshold. In this case, it may be considered that the physical data block is not the cold data block.

S307: Compare a sum of instant write stamps stored in adjacent physical data blocks with the instant write stamp of the physical data block.

The adjacent physical data blocks are adjacent physical data blocks of the physical data block in physical space. For a physical data block, a quantity N of adjacent physical data blocks of the physical data block is determined by an arrangement manner of data by the controller. For example, if the controller separately configures physical data block B and C on a left side and a right side of a physical data block A, the physical data blocks B and C may be considered as adjacent data blocks of A. If the controller separately configures physical data blocks B, C, D, and E on top, bottom, left, and right of the physical data block A, the physical data blocks B, C, D, and E may all be considered as adjacent data blocks of A.

Because there may be a plurality of adjacent data blocks of a data block, when determining a disturbed data block, comparison and determining need to be performed based on a sum of instant write stamps of all adjacent data blocks of the data block.

S308: Determine, based on a difference between the sum of the instant write stamps stored in the adjacent physical data blocks and the instant write stamp of the physical data block, a quantity of times that the physical data block is disturbed.

S309: Determine whether the quantity of times that the physical data block is disturbed reaches a second preset threshold.

If the quantity of times that the physical data block is disturbed reaches the second preset threshold, step S310 is performed; otherwise, no additional processing is required.

Optionally, the second preset threshold may be preconfigured by a system, or may be preconfigured for a user to select, or may be customized by the user. This is not limited in this embodiment of this application.

It should be noted that the first and the second of the first preset threshold and the second preset threshold are merely intended to distinguish the two objects by name, and do not constitute any limitation on a sequence.

S310: Determine that the physical data block is the disturbed data block.

Optionally, the inspection needs a specific time, and in the time, a write operation may exist on adjacent physical data blocks, which causes a change in the quantity of times that the physical data block is disturbed. Therefore, when the quantity of times that the physical data block is disturbed is determined, comprehensive determining may be performed based on the quantity of times that the physical data block is disturbed and a possible future maximum quantity of times that the physical data block is disturbed when the physical data block is inspected again.

A specific operation is as follows: When the physical data block is inspected, determining, based on a quantity of remaining write times when a current global write stamp reaches a next inspection of the physical data block, the future maximum quantity of times that the physical data block is disturbed. In other words, it is considered that in an extreme case, the physical data block is used as the last physical data block that is inspected in this inspection period, and it is considered that all remaining write times when the next inspection is reached are distributed on the adjacent physical data blocks of the physical data block. This disturbs the physical data block.

Determining whether a sum of the quantity of times that the physical data block is disturbed and the future maximum quantity of times that the physical data block is disturbed reaches the second preset threshold; and if the sum of the quantity of times that the physical data block is disturbed and the future maximum quantity of times that the physical data block is disturbed reaches the second preset threshold, determining that the physical data block is the disturbed data block.

In the extreme case, the disturbed data block can be moved as soon as possible, to reduce a risk of data invalidity and improve reliability of the storage medium.

S311: Reconfigure a mapping relationship between a physical block address and a logical block address of the cold data block and a mapping relationship between a physical block address and a logical block address of the disturbed data block to implement moving.

Optionally, before moving processing is performed, whether data stored in the to-be-moved data block is valid data may be further queried and determined. If the data is invalid data, the data is discarded and no processing is performed. If the data is valid data, a moving processing step is performed.

In this embodiment of this application, the concept of the global write stamp is introduced to record the quantity of write times, and there is no need to read existing information about the quantity of write times before writing. Therefore, an I/O access path can be shortened, and processing efficiency can be improved. A global write stamp when a write operation is performed on each physical data block is used as an instant write stamp of each physical data block, and then the cold data block is filtered by comparing the instant write stamp with the global write stamp. At the same time, the disturbed data block can be filtered by comparing an instant write stamp of a victim with that of an aggressor. In this way, wear and disturbance can be discriminated at the same time, and a plurality of reliability problems of the storage medium can be normalized. Module dependency is low, and background algorithm overheads are greatly reduced. In addition, this multi-step discrimination and task decoupling manner simplifies a processing process and improves processing efficiency.

Figure 4:
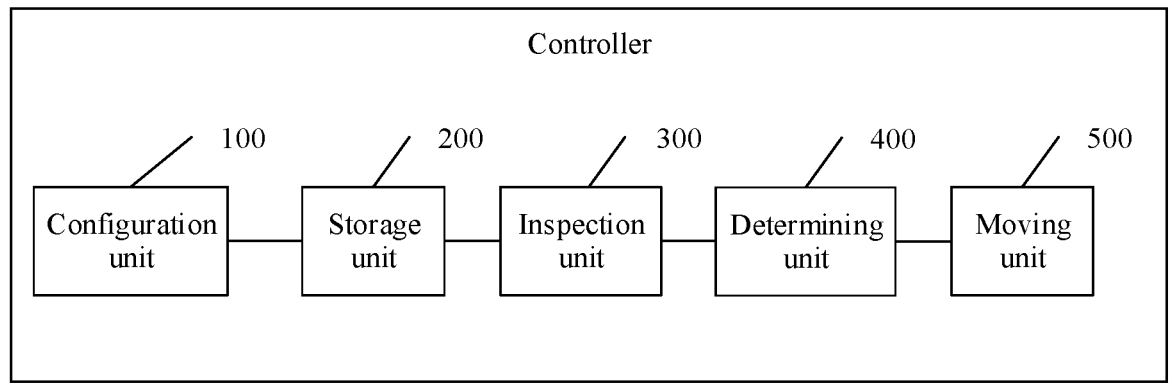
FIG. 4 is a schematic diagram of composition of a controller according to an embodiment of this application.

FIG. 4 is a schematic diagram of composition of a controller according to an embodiment of this application. The controller may include:

a configuration unit 100, adapted to configure, by a controller, a counter of a global write stamp, where the global write stamp is used to represent a total quantity of times that the controller performs writing on a storage medium;

a storage unit 200, adapted to: when a write operation is performed on a physical data block in the storage medium, use a global write stamp at the moment as an instant write stamp of the physical data block, and store the instant write stamp in metadata of the physical data block;

an inspection unit 300, adapted to inspect all physical data blocks in the storage medium, and when a count of the global write stamp increases by a quantity threshold each time, trigger a check on a corresponding single physical data block based on an inspection sequence;

a determining unit 400, adapted to: when the physical data block is inspected, determine, based on the instant write stamp in the metadata of the physical data block, whether the physical data block is a to-be-moved data block, where the to-be-moved data block includes a cold data block and a disturbed data block; and a moving unit 500, adapted to: if the physical data block is the to-be-moved data block, move the physical data block.

Optionally, the determining unit 400 is specifically adapted to:

determine, based on the instant write stamp of the physical data block and a current global write stamp, whether the physical data block is the cold data block; and determine, based on the instant write stamp of the physical data block and instant write stamps stored in adjacent physical data blocks, whether the physical data block is the disturbed data block.

Optionally, when determining, based on the instant write stamp of the physical data block and the current global write stamp, whether the physical data block is the cold data block, the determining unit 400 is specifically adapted to:

compare the current global write stamp with the instant write stamp of the physical data block;

determine whether a difference between the current global write stamp and the instant write stamp of the physical data block reaches a first preset threshold; and if the difference reaches the first preset threshold, determine that the physical data block is the cold data block.

Optionally, when determining, based on the instant write stamp of the physical data block and the instant write stamps stored in the adjacent physical data blocks, whether the physical data block is the disturbed data block, the determining unit 400 is specifically adapted to:

compare a sum of the instant write stamps stored in the adjacent physical data blocks with the instant write stamp of the physical data block;

determine, based on a difference between the sum of the instant write stamps stored in the adjacent physical data blocks and the instant write stamp of the physical data block, a quantity of times that the physical data block is disturbed;

determine whether the quantity of times that the physical data block is disturbed reaches a second preset threshold; and if the quantity of times that the physical data block is disturbed reaches the second preset threshold, determine that the physical data block is the disturbed data block.

Optionally, the determining unit 400 is further adapted to:

when the physical data block is inspected, determine, based on a quantity of remaining write times from the current global write stamp to a next inspection of the physical data block, a future maximum quantity of times that the physical data block is disturbed;

determine whether a sum of the quantity of times that the physical data block is disturbed and the future maximum quantity of times that the physical data block is disturbed reaches the second preset threshold; and if the sum of the quantity of times that the physical data block is disturbed and the future maximum quantity of times that the physical data block is disturbed reaches the second preset threshold, determine that the physical data block is the disturbed data block.

Optionally, a counting unit of the counter is x, and x is an integer greater than or equal to 1.

Optionally, the moving unit 500 is specifically adapted to:

reconfigure a mapping relationship between a physical block address and a logical block address of the to-be-moved data block to implement moving.

Optionally, if a quantity of to-be-moved data blocks determined during inspection is more than one, the moving unit 500 is adapted to perform synchronous processing or asynchronous processing on the more than one to-be-moved data blocks when performing moving processing.

Figure 5:
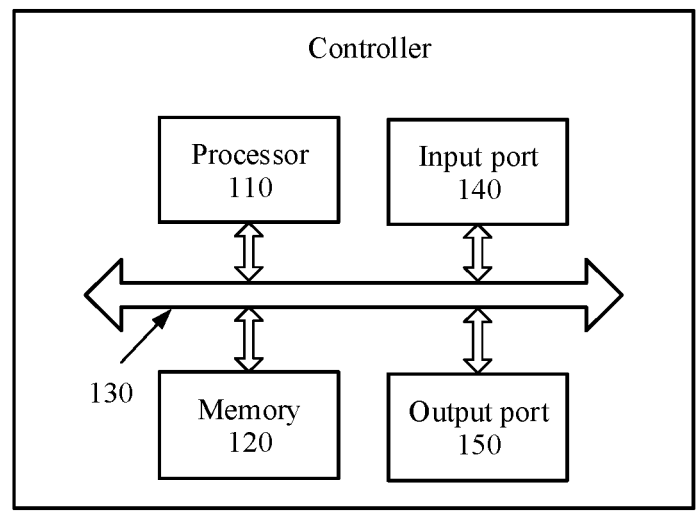
FIG. 5 is a schematic diagram of composition of another controller according to an embodiment of this application.

FIG. 5 is a schematic diagram of composition of another controller according to an embodiment of this application. As shown in FIG. 5, the controller may include a processor 110, a memory 120, and a bus 130. The processor 110 and the memory 120 are connected through the bus 130. The memory 120 is adapted to store an instruction. The processor 110 is adapted to execute the instruction stored in the memory 120, to implement the steps in the methods corresponding to FIG. 3A, FIG. 3B, and FIG. 2.

Further, the controller may further include an input port 140 and an output port 150. The processor 110, the memory 120, the input port 140, and the output port 150 may be connected through the bus 130.

The processor 110 is adapted to execute the instruction stored in the memory 120, to control the input port 140 to receive a signal, and control the output port 150 to send a signal, to complete the steps performed by the controller in the foregoing methods. The input port 140 and the output port 150 may be a same physical entity or different physical entities. When the input port 140 and the output port 150 are the same physical entity, the input port 140 and the output port 150 may be collectively referred to as an input/output port. The memory 120 may be integrated into the processor 110, or may be disposed separately from the processor 110.

In an implementation, it may be considered that functions of the input port 140 and the output port 150 are implemented by using a transceiver circuit or a dedicated transceiver chip. It may be considered that the processor 110 is implemented by using a dedicated processing chip, a processing circuit, a processor, or a general-purpose chip.

In another implementation, it may be considered that the controller provided in this embodiment of this application is implemented by using a general-purpose computer. To be specific, program code that is used to implement functions of the processor 110, the input port 140, and the output port 150 is stored in the memory, and a general-purpose processor implements the functions of the processor 110, the input port 140, and the output port 150 by executing the code in the memory.

For a concept, an explanation, a detailed description, and other steps with respect to the controller that are related to the technical solutions provided in this embodiment of this application, refer to descriptions of the content in the foregoing methods or another embodiment. Details are not described herein again.

A person skilled in the art may understand that for ease of description, FIG. 5 shows only one memory and only one processor. Actually, a controller may include a plurality of processors and a plurality of memories. The memory may also be referred to as a storage medium, a storage device, or the like. This is not limited in this embodiment of this application. In the embodiment of this application, the processor may be a central processing unit (CPU), or the processor may be another general purpose processor, a digital signal processor (DSP), an application-specific integrated circuit (ASIC), a field programmable gate array (FPGA), or another programmable logic device, discrete gate or transistor logic device, discrete hardware component, or the like. The general purpose processor may be a microprocessor, or the processor may be any conventional processor or the like. The memory may include a read-only memory and a random access memory, and provide an instruction and data to the processor. A part of the memory may further include a non-volatile random access memory. The bus may further include a power bus, a control bus, a status signal bus, and the like, in addition to a data bus. However, for clear description, various types of buses in the figure are marked as the bus.

According to the method and the controller provided in the embodiments of this application, an embodiment of this application further provides a computer system, including a CPU, a controller, and a storage medium. For a relationship between the CPU, the controller, and the storage medium and an instruction procedure, refer to descriptions and explanations of the embodiments in FIG. 1 to FIG. 3A and FIG. 3B. Details are not described herein again.

It should be understood that sequence numbers of the foregoing processes do not mean execution sequences in various embodiments of this application. The execution sequences of the processes should be determined according to functions and internal logic of the processes, and should not be construed as any limitation on the implementation processes of the embodiments of this application.

A person of ordinary skill in the art may be aware that, in combination with illustrative logical blocks described in the embodiments disclosed in this specification and steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

In the embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of this application are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method for processing a data block, comprising:
configuring, by a controller, a counter of a global write stamp, wherein the global write stamp is used to represent a total quantity of times that the controller performs writing on a storage medium coupled to the controller;
when a write operation is performed on a physical data block in the storage medium, using, as an instant write stamp of the physical data block, current value of the global write stamp, and storing the instant write stamp;
inspecting physical data blocks in the storage medium periodically; and
when the physical data block is inspected, determining, based on the stored instant write stamp of the physical data block, whether the physical data block is a to-be-moved data block, wherein the to-be-moved data block is also a cold data block and a disturbed data block, and wherein the determining, based on the stored instant write stamp of the physical data block, whether the physical data block is the to-be-moved data block comprises determining, by the controller based on the stored instant write stamp of the physical data block and instant write stamps stored in adjacent physical data blocks, that the physical data block is the disturbed data block, wherein each of the instant write stamps uses respective current value of the global write stamp.

2. The method according to claim 1, wherein the determining, based on the stored instant write stamp of the physical data block, whether the physical data block is the to-be-moved data block comprises:
determining, by the controller based on the stored instant write stamp of the physical data block and a first current value of the global write stamp, that the physical data block is the cold data block.

3. The method according to claim 2, wherein the determining, by the controller based on the stored instant write stamp of the physical data block and the first current value of the global write stamp, whether the physical data block is the cold data block comprises:
comparing, by the controller, the first current value of the global write stamp with the stored instant write stamp of the physical data block;
determining whether a difference between the first current value of the global write stamp and the stored instant write stamp of the physical data block reaches a first preset threshold; and
in response to determining that the difference reaches the first preset threshold, determining that the physical data block is the cold data block.

4. The method according to claim 1, wherein the determining, by the controller based on the stored instant write stamp of the physical data block and the instant write stamps stored in the adjacent physical data blocks, that the physical data block is the disturbed data block comprises:
comparing, by the controller, a sum of the instant write stamps stored in the adjacent physical data blocks with the stored instant write stamp of the physical data block;
determining, based on a difference between $j$ the sum of the instant write stamps stored in the adjacent physical data blocks and ii the stored instant write stamp of the physical data block, a quantity of times that the physical data block is disturbed;
determining whether the quantity of times that the physical data block is disturbed reaches a second preset threshold; and
in response to determining that the quantity of times that the physical data block is disturbed reaches the second preset threshold, determining that the physical data block is the disturbed data block.

5. The method according to claim 4, wherein the method further comprises:
when the physical data block is inspected, determining, based on a quantity of remaining write times from the first current value of the global write stamp to a next inspection of the physical data block, a future maximum quantity of times that the physical data block is disturbed;
determining whether a sum of the quantity of times that the physical data block is disturbed and the future maximum quantity of times that the physical data block is disturbed reaches the second preset threshold; and
in response to determining that the sum of the quantity of times that the physical data block is disturbed and the future maximum quantity of times that the physical data block is disturbed reaches the second preset threshold, determining that the physical data block is the disturbed data block.

6. The method according to claim 1, wherein a counting unit of the counter is x, and x is an integer greater than or equal to 1.

7. The method according to claim 1, further comprising:
reconfiguring, by the controller, a mapping relationship between a physical block address and a logical block address of the to-be-moved data block, to move the to-be-moved data block.

8. The method according to claim 1, further comprising, in response to determining that a quantity of to-be-moved data blocks determined during inspection is more than one:
performing synchronous processing or asynchronous processing on the more than one to-be-moved data blocks when moving the to-be-moved data blocks.

9. A controller, comprising:
at least one processor; and
one or more memories coupled to the at least one processor and storing programming instructions for execution by the at least one processor to:
configure a counter of a global write stamp, wherein the global write stamp is used to represent a total quantity of times that the controller performs writing on a storage medium coupled to the controller;
when a write operation is performed on a physical data block in the storage medium, use, as an instant write stamp of the physical data block, current value of the global write stamp, and store the instant write stamp;
inspect physical data blocks in the storage medium periodically; and
when the physical data block is inspected, determine, based on the stored instant write stamp of the physical data block, whether the physical data block is a to-be-moved data block, wherein the to-be-moved data block is also a cold data block and a disturbed data block, and wherein the determining, based on the stored instant write stamp of the physical data block, whether the physical data block is the to-be-moved data block comprises determining, based on the stored instant write stamp of the physical data block and instant write stamps stored in adjacent physical data blocks, that the physical data block is the disturbed data block, wherein each of the instant write stamps uses respective current value of the global write stamp.

10. The controller according to claim 9, wherein the programming instructions are for execution by the at least one processor to:
determine, based on the stored instant write stamp of the physical data block and a first current value of the global write stamp, that the physical data block is the cold data block.

11. The controller according to claim 10, wherein the programming instructions are for execution by the at least one processor to:
compare the first current value of the global write stamp with the stored instant write stamp of the physical data block;
determine whether a difference between the first current value of the global write stamp and the stored instant write stamp of the physical data block reaches a first preset threshold; and
in response to determining that the difference reaches the first preset threshold, determine that the physical data block is the cold data block.

12. The controller according to claim 10, wherein the programming instructions are for execution by the at least one processor to:
compare a sum of the instant write stamps stored in the adjacent physical data blocks with the stored instant write stamp of the physical data block;

determine, based on a difference between i) the sum of the instant write stamps stored in the adjacent physical data blocks and ii) the stored instant write stamp of the physical data block, a quantity of times that the physical data block is disturbed;

determine whether the quantity of times that the physical data block is disturbed reaches a second preset threshold; and in response to determining that the quantity of times that the physical data block is disturbed reaches the second preset threshold, determine that the physical data block is the disturbed data block.

13. The controller according to claim 12, wherein the programming instructions are for execution by the at least one processor to:

when the physical data block is inspected, determine, based on a quantity of remaining write times from the first current value of the global write stamp to a next inspection of the physical data block, a future maximum quantity of times that the physical data block is disturbed;

determine whether a sum of the quantity of times that the physical data block is disturbed and the future maximum quantity of times that the physical data block is disturbed reaches the second preset threshold; and in response to determining that the sum of the quantity of times that the physical data block is disturbed and the future maximum quantity of times that the physical data block is disturbed reaches the second preset threshold, determine that the physical data block is the disturbed data block.

14. The controller according to of claim 9, wherein the programming instructions are for execution by the at least one processor to:

reconfigure a mapping relationship, between a physical block address and a logical block address of the to-be-moved data block, to implement moving of the to-be-moved data block.

\* \* \* \* \*

UNITED STATES PATENT AND TRADEMARK OFFICE
CERTIFICATE OF CORRECTION

| | |
|---|---|
| PATENT NO. | : 11,360,714 B2 |
| APPLICATION NO. | : 17/157342 |
| DATED | : June 14, 2022 |
| INVENTOR(S) | : Lu Xu |

It is certified that error appears in the above-identified patent and that said Letters Patent is hereby corrected as shown below:

On the Title Page

Column 2, Item (57) Abstract/Line 4 - Delete "stamp" and insert -- stamp, --.

In the Claims

Column 15/Line 35 - In Claim 4, delete "j" and insert -- i) --.

Column 15/Line 37 - In Claim 4, delete "ii" and insert -- ii) --.

Column 16/Line 2 - In Claim 7, delete "relationship" and insert -- relationship, --.

Column 18/Line 12 (Approx.) - In Claim 14, delete "to of" and insert -- to --.

Signed and Sealed this
Twenty-fifth Day of October, 2022

*Katherine Kelly Vidal*

Katherine Kelly Vidal
*Director of the United States Patent and Trademark Office*